United States Patent
Gloeckler

(10) Patent No.: US 9,559,247 B2
(45) Date of Patent: Jan. 31, 2017

(54) PHOTOVOLTAIC DEVICE CONTAINING AN N-TYPE DOPANT SOURCE

(75) Inventor: Markus Gloeckler, Perrysburg, OH (US)

(73) Assignee: First Solar, Inc., Perrysburg, OH (US)

(*) Notice: Subject to any disclaimer, the term of this patent is extended or adjusted under 35 U.S.C. 154(b) by 205 days.

(21) Appl. No.: 13/232,161

(22) Filed: Sep. 14, 2011

(65) Prior Publication Data
US 2012/0067392 A1  Mar. 22, 2012

Related U.S. Application Data

(60) Provisional application No. 61/385,436, filed on Sep. 22, 2010.

(51) Int. Cl.
| | |
|---|---|
| *H01L 31/18* | (2006.01) |
| *H01L 31/0224* | (2006.01) |
| *H01L 31/073* | (2012.01) |
| *H01L 31/0392* | (2006.01) |
| *H01L 31/0296* | (2006.01) |

(52) U.S. Cl.
CPC ..... *H01L 31/1864* (2013.01); *H01L 31/02963* (2013.01); *H01L 31/022466* (2013.01); *H01L 31/03925* (2013.01); *H01L 31/073* (2013.01); *H01L 31/1828* (2013.01); *Y02E 10/543* (2013.01); *Y02P 70/521* (2015.11)

(58) Field of Classification Search
USPC ................................ 136/255, 260, 252
See application file for complete search history.

(56) References Cited

U.S. PATENT DOCUMENTS

| | | | |
|---|---|---|---|
| 5,279,678 A | 1/1994 | Jordan et al. | |
| 5,578,502 A | 11/1996 | Albright et al. | |
| 6,137,048 A * | 10/2000 | Wu et al. | 136/260 |
| 6,172,382 B1 | 1/2001 | Nagahama et al. | |
| 6,657,234 B1 | 12/2003 | Tanizawa | |
| 7,193,246 B1 | 3/2007 | Tanizawa et al. | |

(Continued)

FOREIGN PATENT DOCUMENTS

| | | |
|---|---|---|
| CN | 101373798 A | 2/2009 |
| WO | WO 2008/112056 A2 | 9/2008 |

(Continued)

OTHER PUBLICATIONS

H. Kim et al., "Effect of aluminum doping on zinc oxide thin films grown by pulsed laser deposition for organic light-emitting devices," Thin Solid Films 377-378, p. 798-802 (2000).*

(Continued)

*Primary Examiner* — Eric R Smith
(74) *Attorney, Agent, or Firm* — Blank Rome LLP

(57) ABSTRACT

Described herein is a method of using the buffer layer of a transparent conductive substrate as a dopant source for the n-type window layer of a photovoltaic device. The dopant source of the buffer layer distributes to the window layer of the photovoltaic device during semiconductor processing. Described herein are also methods of manufacturing embodiments of the substrate structure and photovoltaic device. Disclosed embodiments also describe a photovoltaic module and a photovoltaic structure with a plurality of photovoltaic devices having an embodiment of the substrate structure.

12 Claims, 7 Drawing Sheets

(56) References Cited

U.S. PATENT DOCUMENTS

| | | | |
|---|---|---|---|
| 2003/0010993 A1 | 1/2003 | Nakamura et al. | |
| 2003/0041894 A1 | 3/2003 | Sverdrup et al. | |
| 2004/0187914 A1* | 9/2004 | Matsuda et al. | 136/255 |
| 2005/0179107 A1 | 8/2005 | Pophristic et al. | |
| 2008/0047603 A1 | 2/2008 | Krasnov | |
| 2008/0092954 A1* | 4/2008 | Choi | 136/262 |
| 2008/0308151 A1 | 12/2008 | Den Boer et al. | |
| 2008/0308156 A1* | 12/2008 | Boyer, Jr. | 136/262 |
| 2009/0020149 A1 | 1/2009 | Woods et al. | |
| 2009/0194166 A1* | 8/2009 | Powell et al. | 136/260 |
| 2009/0211627 A1 | 8/2009 | Meier et al. | |
| 2010/0012188 A1* | 1/2010 | Garnett | H01L 31/02966 136/260 |
| 2010/0015753 A1* | 1/2010 | Garnett | 438/84 |
| 2010/0186810 A1 | 7/2010 | Romeo | |
| 2010/0186815 A1 | 7/2010 | Yang et al. | |
| 2011/0005591 A1 | 1/2011 | Buller et al. | |
| 2011/0011451 A1* | 1/2011 | Hakuma et al. | 136/255 |
| 2011/0018089 A1* | 1/2011 | Hakuma et al. | 257/463 |

FOREIGN PATENT DOCUMENTS

| | | |
|---|---|---|
| WO | WO 2009110092 A1 * | 9/2009 |
| WO | WO 2009110093 A1 * | 9/2009 |
| WO | WO 2011/075579 A1 | 6/2011 |

OTHER PUBLICATIONS

"CRC Handbook of Chemistry and Physics, 93rd ed., Internet Version 2013," W. M. Haynes editor, p. 4-54, 4-100 [retrieved from internet at http://www.hbcpnetbase.com on May 29, 2013].*

P. K. Manoj, et al., "Preparation and characterization of indium-doped tin oxide thin films", Ceramics International 33, p. 273-278 (2007).*

W. Storr, "Semiconductor Basics" [retrieved from internet at http://web.archive.org/web/20090322181842/http://electronics-tutorials.ws/diode/diode_1.htm on Sep. 10, 2014].I.*

* cited by examiner

PHOTOVOLTAIC DEVICE CONTAINING AN N-TYPE DOPANT SOURCE

This application claims priority under 35 U.S.C. §119(e) to Provisional Application No. 61/385,436, filed on Sep. 22, 2010, which is hereby incorporated by reference in its entirety.

FIELD OF THE INVENTION

Embodiments of the invention relate to the field of photovoltaic (PV) power generation systems, and more particularly to a photovoltaic device and a manufacturing method thereof.

BACKGROUND OF THE INVENTION

A photovoltaic device converts the energy of sunlight directly into electricity by the photovoltaic effect. The photovoltaic device can be, for example, a photovoltaic cell, such as a crystalline silicon cell or a thin-film cell. In thin-film photovoltaic devices, the photovoltaic cell can include a substrate and an active material layer formed between a front support and a back support. The front and back supports are made of a transparent material, such as, glass, to allow light to pass through to the active material layer. The active material layer is formed of one or more layers of semiconductor material such as cadmium telluride (CdTe) or cadium sulfide (CdS).

The growing demand for solar power pushes for advancements in photovoltaic devices which will produce higher energy yields. At the same time, as demand to produce highly efficient photovoltaic devices grows, there is a need to reduce the costs of manufacturing these photovoltaic devices. Accordingly, a photovoltaic device with improved energy output and lower manufacturing costs is desirable.

DETAILED DESCRIPTION OF THE INVENTION

In the following detailed description, reference is made to the accompanying drawings which form a part hereof, and in which is shown by way of illustration specific embodiments that may be practiced. It should be understood that like reference numbers represent like elements throughout the drawings. These embodiments are described in sufficient detail to enable those skilled in the art to make and use them, and it is to be understood that structural, material, electrical, and procedural changes may be made to the specific embodiments disclosed, only some of which are discussed in detail below.

Described herein is a transparent conductive substrate containing an n-type dopant source. The substrate can be included in a photovoltaic device for converting solar energy into electricity. During semiconductor processing of the photovoltaic device, the n-type dopant intentionally introduced into the substrate structure diffuses into the active material layer of the photovoltaic device causing the active material layer of the photovoltaic device to have a desired effective carrier concentration after semiconductor processing. The increased carrier density of the active material layer produces higher energy yields for the photovoltaic device. Described herein are also methods of manufacturing embodiments of the transparent conductive substrate structure containing an n-type dopant source. Disclosed embodiments also describe a photovoltaic module and a photovoltaic structure with a plurality of photovoltaic devices having an embodiment of the substrate structure.

Figure 1:
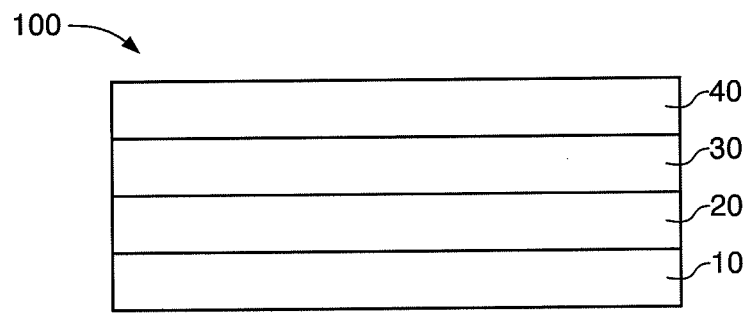
FIG. 1 is a cross-sectional view of a substrate structure in accordance with a disclosed embodiment.

FIG. 1 is a cross-sectional view of a transparent conductive substrate structure 100 used for photovoltaic devices. The substrate structure 100 is made up of multiple sequential layers of various materials deposited on a front support 10. Layers of the substrate structure 100 can include one or more barrier layers 20, one or more transparent conductive oxide (TCO) layers 30, and one or more buffer layers 40. Front support layer 10 is made of an insulative material that is transparent or translucent to light, such as soda lime glass, low Fe glass, solar float glass or other suitable glass. Barrier layer 20 can be silicon oxide, silicon aluminum oxide, tin oxide, or other suitable material or a combination thereof. TCO layer 30 can be doped tin oxide, cadmium tin oxide, tin oxide, indium oxide, zinc oxide or other transparent conductive oxide or combination thereof. Buffer layer 40 can be tin oxide, zinc tin oxide, zinc magnesium oxide, zinc sulfur oxide or other transparent conductive oxide or a combination thereof. Preferably, buffer layer 40 is made from a material less conductive than the TCO layer 30. The buffer material 40 may have a thickness from about 0.1 nm to about 1000 nm, or from about 0.1 nm to about 300 nm.

Figure 2:
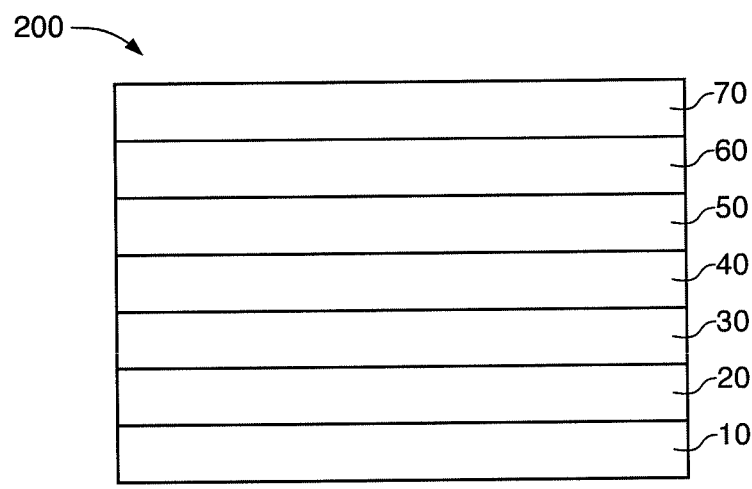
FIG. 2 is a cross-sectional view of a photovoltaic device in accordance with a disclosed embodiment.

Substrate structure 100 can be included in a photovoltaic device 200 such as, a solar cell, as shown in FIG. 2. Device 200 includes an active material layer that is made up of at least one semiconductor window layer 50 and at least one semiconductor absorber layer 60. The active material layer and the substrate structure 100 is formed between the front support 10 and the back support 70. Front support 10 and back support 70 provide structural support and protect the active material layer from environmental hazards. Back support 70 may act as an electrode and can be made of molybdenum, aluminum, copper, or any other high conductive materials. Absorber layer 60 may generate photo carriers upon absorption of solar radiation and can be made of amorphous silicon (a-Si), copper indium gallium diselenide (CIGS), cadmium telluride (CdTe) or any other suitable light absorbing material. Window layer 50 can mitigate the internal loss of photo carriers (e.g., electrons and holes) in device 200. Window layer 50 is a semiconductor material, such as cadium sulfide (CdS), zinc sulfide (ZnS), cadium zinc sulfide (CdZnS), zinc magnesium oxide (ZnMgO) or any other suitable photovoltaic semiconductor material.

The buffer layer 40 is important for the performance and stability of the device 200. For example, in a device 200 that uses CdTe (or similar material) as the absorber layer 60, the buffer layer 40 is a relatively resistive material as compared to the TCO layer 30, and provides an interface for the window layer 50 (relatively resistive) and TCO layer 30 (highly conductive). Among the solar cell performance parameters, open circuit voltage (Voc), fill factor (FF) and short-circuit conductance (Gsc) are closely related to the buffer layer 40 design. Buffer layer 40 enhance performance, by increasing Voc and FF. TCO layer 30 allows for solar radiation to enter device 200 and further acts as an electrode.

It should be noted that photovoltaic device 200 is not intended to be considered a limitation on the types of photovoltaic devices to which the present invention may be applied, but rather a convenient representation for the following description. The photovoltaic device 100 may be representative of any type of thin-film or other type of solar cell. In addition, each of these layers (10, 20, 30, 40, 50, 60, 70) can include one or more layers or films, one or more different types of materials and/or or same material types with differing compositions. And although the layers 10, 20, 30, 40, 50, 60, 70 are shown stacked with layer 10 on the bottom, the layers 10, 20, 30, 40, 50, 60, 70 can be reversed such that the layer 70 is on the bottom or arranged in a horizontal orientation. The layers can also have differing thicknesses and other dimensions. Additionally, each layer can cover all or a portion of the device 200 and/or all or a portion of the layer or substrate underlying the layer. For example, a "layer" can include any amount of any material that contacts all or a portion of a surface. Other materials may be optionally included in the substrate structure 100 or device 200 beyond what is mentioned to further improve performance such as AR coatings, color suppression layers, etc.

Device 200 can be formed by depositing the window layer 50, such as CdS, and the absorber layer 60, such as CdTe, on the substrate structure 100. The deposition of the materials or the consecutive annealing or both occur at elevated temperatures typically in range of 400-600° C., but could be higher or lower for short amounts of time. In devices 200 including a window material 50 of CdS and semiconductor material 60 CdTe (a CdS/CdTe device), there is typically no intentional n-type dopant introduced during the deposition of either material or the following annealing step.

Embodiments of substrate structure 100 enable localized and controlled dopant introduction into the n-type window layer 50 by introducing the dopant into the buffer layer 40 of the substrate structure 100 before semiconductor processing. It should be appreciated that the entire buffer layer 40 or a portion thereof can be uniformly doped prior to the formation of the window layer 50 and the absorber layer 60. If the buffer layer 40 is comprised of multiple buffer layers then a dopant can be introduced into one or more of the buffer layers to form a dopant-rich region in the buffer layer 40, and leaving the other buffer layers dopant-free before semiconductor processing. During the semiconductor or thermal processing of the device 200 (deposition and/or annealing), the dopant will diffuse from the adjacent buffer layer 40 into the window layer 50. The increased carrier density in the n-type window layer 50 can thereby improve performance of the device 200.

In each embodiment described below and as depicted in FIGS. 3A through 6B, reference X represents a dopant of an initial concentration in the buffer layer 40 before semiconductor or thermal processing. References X1 and X3 represent dopants of concentrations less than reference X in the buffer layer 40 after semiconductor processing. Reference X2 represent a dopant concentration less than reference X in the window layer 50 after semiconductor processing. In each embodiment described below, references X1, X2 and X3 represent dopants of concentrations less than reference X. The embodiments do not depict the barrier layer 20 which is not used in the illustrated embodiments.

Figure 3A:
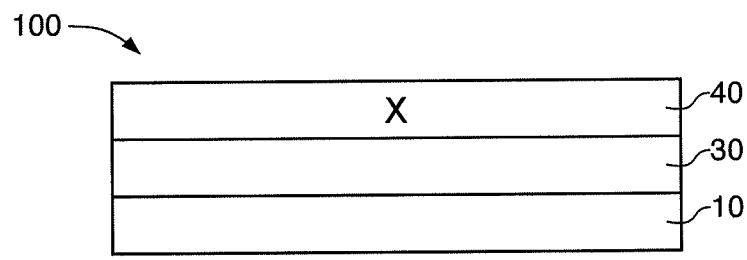
FIG. 3A illustrates a substrate structure before semiconductor processing in accordance with a disclosed embodiment.
Figure 4A:
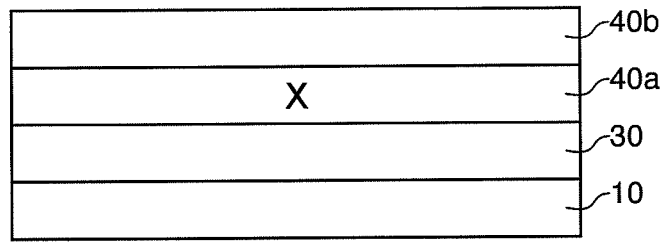
FIG. 4A illustrates a substrate structure before semiconductor processing in accordance with another disclosed embodiment.
Figure 5A:
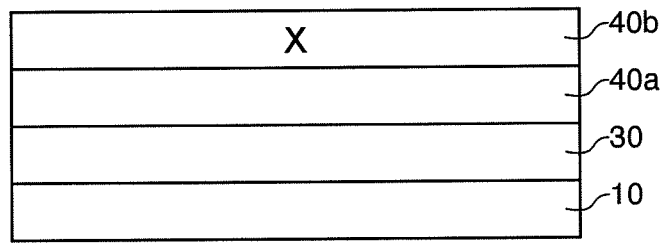
FIG. 5A illustrates a substrate structure before semiconductor processing in accordance with another disclosed embodiment.
Figure 6A:
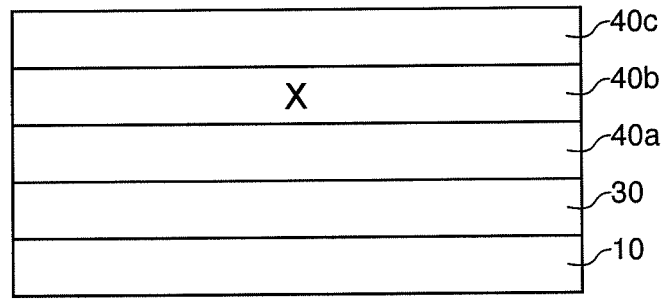
FIG. 6A illustrates a substrate structure before semiconductor processing in accordance with another disclosed embodiment.

The dopant distribution within the buffer layer 40 can be used to control dopant release from the buffer layer 40 to achieve a desired effective carrier concentration in window layer 50. Embodiments of substrate structure 100 include: a buffer layer 40 that has a uniformly contained dopant (as depicted in FIG. 3A); two buffer layers 40a-b in which buffer layer 40a has a dopant-rich region that is buried under the dopant-free buffer layer 40b (as depicted in FIG. 4A), two buffer layers 40a-b in which buffer layer 40b has a dopant-rich region near the surface of substrate structure 100 and buffer layer 40a is dopant-free (as depicted in FIG. 5A), or three buffer layers 40a-c in which buffer layer 40b has a dopant-rich region that is embedded between two dopant-free buffer layers 40a and 40c (as depicted in FIG. 6A). It will be appreciated that other possible variations of doping barrier layer 40 with an n-type dopant source are known to those skilled in the art.

In all of the below described embodiments, the effective carrier concentrations of X1 and X3 can be controlled based on adjusting the initial concentration X of the dopant introduced in buffer layer 40 and the location of the dopant-rich region in the buffer layer 40.

Dopants are n-type elements and can be selected from group III elements of the periodic table (such as Ga, In, Al, Ti and B), or from group VII elements (such as Fl, Cl, I, Br and At).

Figure 3B:
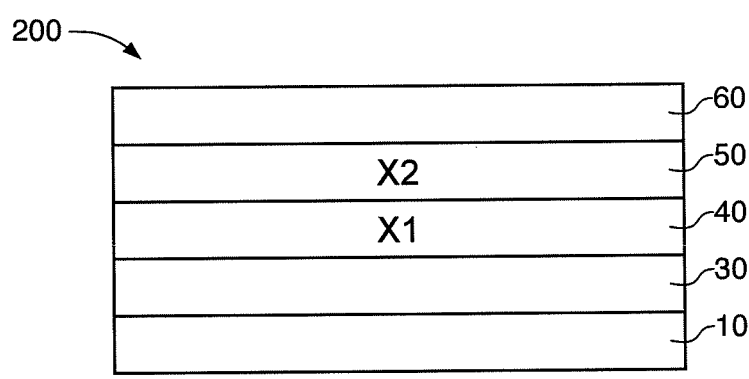
FIG. 3B illustrates dopant source distribution in a photovoltaic device having the substrate structure of FIG. 3A after semiconductor processing in accordance with a disclosed embodiment.

FIG. 3A illustrates a substrate structure 100 with a uniformly doped buffer layer 40 before thermal processing. FIG. 3B illustrates the device 200 after formation of the window layer 50 and the absorber layer 60 when the dopant source contained in buffer layer 40 has diffused into window layer 50. As depicted in FIG. 3B, after the thermal processing of the device 200 (deposition and/or annealing), the dopant concentrations in the buffer layer 40 is X1 and in the window layer 50 is X2, which are both lower than the initial dopant concentration of X. In one embodiment, X is selected such that X2 has an effective carrier concentration between about $1 \times 10^{14}$ atoms/cm$^3$ to about $1 \times 10^{19}$ atoms/cm$^3$.

Figure 4B:
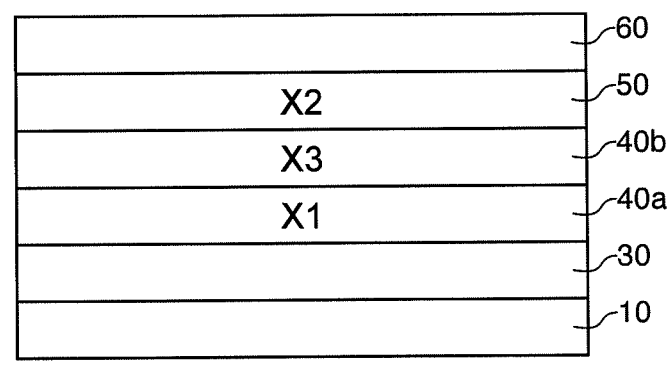
FIG. 4B illustrates dopant source distribution in a photovoltaic device having the substrate structure of FIG. 4A after semiconductor processing in accordance with another disclosed embodiment.

FIG. 4A illustrates substrate structure 100 with two buffer layers 40a-b in which buffer layer 40a has a dopant-rich region that is buried under the dopant-free buffer layer 40b prior to thermal processing. FIG. 4A shows the dopant-rich region is closer to the TCO layer 30 than the surface of the substrate 100. FIG. 4B illustrates dopant source distribution in the device 200 having the buffer layer 40a with the buried dopant-rich region after thermal processing. Following thermal processing of the device 200 (deposition and/or annealing) having the buried dopant-rich region shown in FIG. 4A, the dopant concentration in window layer 50 is X2, the dopant concentration in the buffer layer 40a is X1 and the dopant concentration in the buffer layer 40b is X3.

Figure 5B:
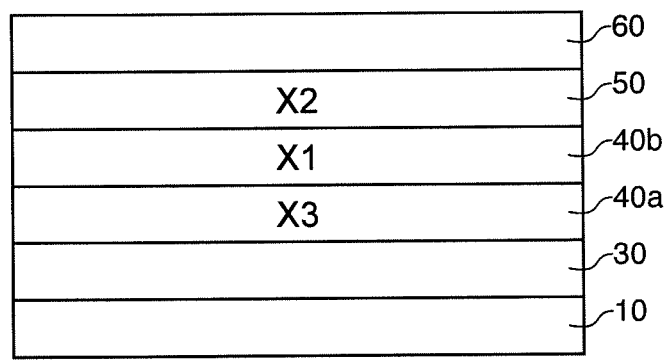
FIG. 5B illustrates dopant source distribution in a photovoltaic device having the substrate structure of FIG. 5A after semiconductor processing in accordance with another disclosed embodiment.

In another embodiment, the dopant-rich region can located in buffer layer 40b at or near the top surface of the substrate structure 100 as depicted in FIG. 5A (easy out diffusion). FIG. 5B illustrates dopant source distribution in the device 200 having the buffer layer 40b with the dopant-rich region after thermal processing. Following thermal processing of the device 200 (deposition and/or annealing) having the top surface dopant-rich region as shown in FIG. 5A, the dopant concentration in window layer 50 is X2, the dopant concentration in the buffer layer 40a is X3 and the dopant concentration in the buffer layer 40b is X1.

Figure 6B:
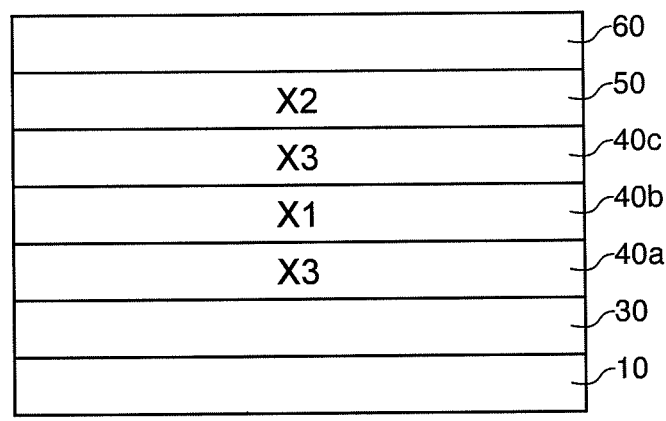
FIG. 6B illustrates dopant source distribution in a photovoltaic device having the substrate structure of FIG. 6A after semiconductor processing in accordance with another disclosed embodiment.

FIG. 6A illustrates substrate structure 100 with a doped buffer layer 40b embedded between two buffer layers 40a and 40c before thermal processing. FIG. 6B illustrates dopant source distribution in the device 200 having the substrate structure 100 with the embedded doped buffer layer 40b after thermal processing. Following thermal processing of the device 200 (deposition and/or annealing), the dopant concentration in window layer 50 is X2, the dopant concentration in the buffer layer 40b is X1, and the dopant concentration in each of the buffer layers 40a and 40c is X3.

Figure 7A:
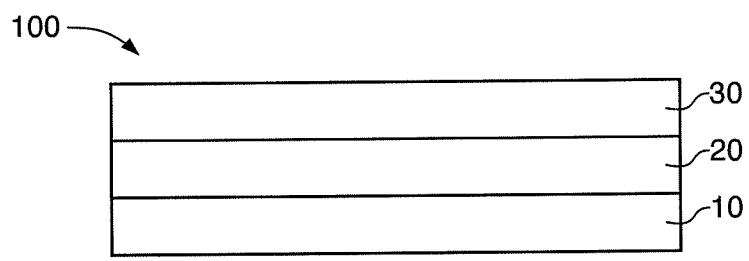
FIGS. 7A and 7B illustrate the formation of a substrate structure in accordance with a disclosed embodiment.
Figure 7B:
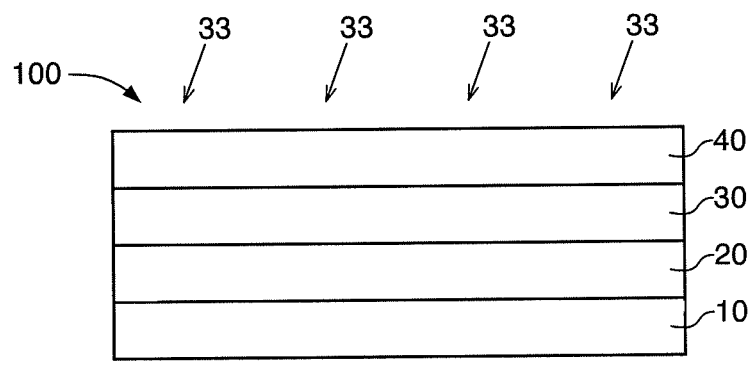

FIG. 7A-7B illustrate the formation of substrate structure 100. An n-type dopant is introduced into structure 100 during the formation process. As shown in FIG. 7A, a front support layer 10 is provided. The barrier layer 20 and TCO layer 30 are formed over the front support layer 10. Each of these layers 20, 30 can be formed by known processes. For example, the barrier layer 20 and the TCO layer 30 can be formed by physical vapor deposition processes, chemical vapor deposition processes or other suitable processes.

The buffer layer 40 can be created through physical deposition, chemical deposition, or any other deposition methods (e.g., atmospheric pressure chemical vapor deposition, evaporation deposition, sputtering and MOCVD, DC Pulsed sputtering, RF sputtering or AC sputtering). Arrows 33 depict the optional step of doping the buffer material 40, which can be accomplished in any suitable manner. A distribution of the dopant within the buffer layer 40 can be created by consecutive deposition of individual layers or films containing the dopant and layers/films not containing the dopant. Alternatively, dopant can be introduced chemically in a chemical vapor deposition (CVD) process, through doped sputter targets in a physical vapor deposition (PVD) process, or by other known techniques.

If a sputtering process is used, the target can be a ceramic target or a metallic target. In one embodiment, the dopant is introduced into the sputtering target(s) at desired concentrations. A sputtering target can be prepared by casting, sintering or various thermal spray methods. In one embodiment, the buffer material 40 is formed from a pre-alloy target comprising the dopant by a reactive sputtering process. In one embodiment, the dopant concentration of the sputter target is about $1 \times 10^{17}$ atoms/cm$^3$ to about $1 \times 10^{18}$ atoms/cm$^3$.

The dopant (and its initial concentration X) can be selected such that the dopant can effectively diffuse from the buffer layer 40 to the window layer 50 given the processing temperature requirements and desired effective concentration in the window layer 50. In one embodiment, the dopant dose to form the buffer layer 40 of FIG. 3A is about $1 \times 10^{11}$ atoms/cm$^2$ to about $1 \times 10^{13}$ atoms/cm$^2$ for a buffer layer 40 having a thickness between 100 Å to about 1000 Å, although any thickness between 10 Å to about 3000 Å can be used. In another embodiment, the dopant dose to form the buffer layer 40 is about $1 \times 10^{9}$ atoms/cm$^2$ to about $1 \times 10^{14}$ atoms/cm$^2$. In yet another embodiment, the buffer layer 40 is doped to have a carrier concentration from about $1 \times 10^{17}$ atoms/cm$^3$ to about $1 \times 10^{18}$ atoms/cm$^3$. The same or similar dopant dose can be used to form the buffer layer 40a of FIG. 4A, the buffer layer 40b of FIG. 5A, and the buffer layer 40b of FIG. 6A.

Providing a n-type dopant to the buffer layer 40 may compromise the functionality of the buffer layer 40, because it is empirically known that appropriate resistivity (i.e., less conductive than the TCO layer 30) is important for the buffer layer 40 to provide its benefit. This can be overcome by the following means: 1) the dopant source concentration in the buffer layer 40 after completion of thermal processing is lower than the free carrier concentration in the absence of the dopant source, or 2) a dopant is used that is effective in the window layer 50 (i.e., create an n-type window layer 50), but not in the buffer layer 40.

In addition, conductivity of the buffer layer 40 can be changed by controlling thermal processing of the buffer layer 40. The buffer layer 40 is an amorphous layer upon deposition. By thermal processing, e.g., thermal annealing, the buffer layer 40 can be converted (in whole or in part) to a crystalline state, which is more conductive relative to the amorphous state. In addition, the active dopant level (and thereby the conductivity) can be varied by thermal processing, e.g., thermal annealing. In this case, both thermal load (i.e., the time of exposure to a temperature and the temperature) and ambient conditions can be manipulated to affect doping levels in the buffer material 40. For example, a slightly reducing or oxygen-depleting environment during an annealing process can lead to higher doping levels and thus enhanced conductivity accordingly. Furthermore, a thermal treating process can be a separate annealing process after deposition of the buffer layer 40 (and before the formation of any other layers on the buffer layer 40) or the processing used in the depositions of the window layer 50 and/or the absorbent layer 60. The thermal processing can be done at temperatures from about 300° C. to about 800° C.

Alternatively, a desired conductivity for the buffer layer 40 can be achieved by controlling oxygen deficiencies of sub-oxides. For example, the amount of oxygen deficiencies can be altered during the formation of the buffer layer 40 by introducing gases and changing the ratio of oxygen to other gasses, e.g., oxygen/argon ratio, during a reactive sputtering process. Generally, for a metal oxide, if it is oxygen deficient, extra electrons of the metal can participate in the conductance, increasing the conductivity of the layer. Thus, conductivity of the buffer layer 40 can be increased by controlling the deposition chamber gas to be oxygen deficient (i.e., by forming the buffer layer 40 in an oxygen deficient environment). For example, supplying forming gas or $N_2$ will reduce the available oxygen gas.

The formation process depicted in FIGS. 7A and 7B can be used in connection with any buffer layer 40, such as tin oxides, zinc tin oxides, zinc magnesium oxides, zinc sulfur oxides, etc., that can be fabricated by CVD or PVD processes. This method is compatible with different window layers 50 that could be deposited by a suitable process such as VTD, such as cadmium sulfide or cadmium zinc sulfide.

Figures 8A, 8B:
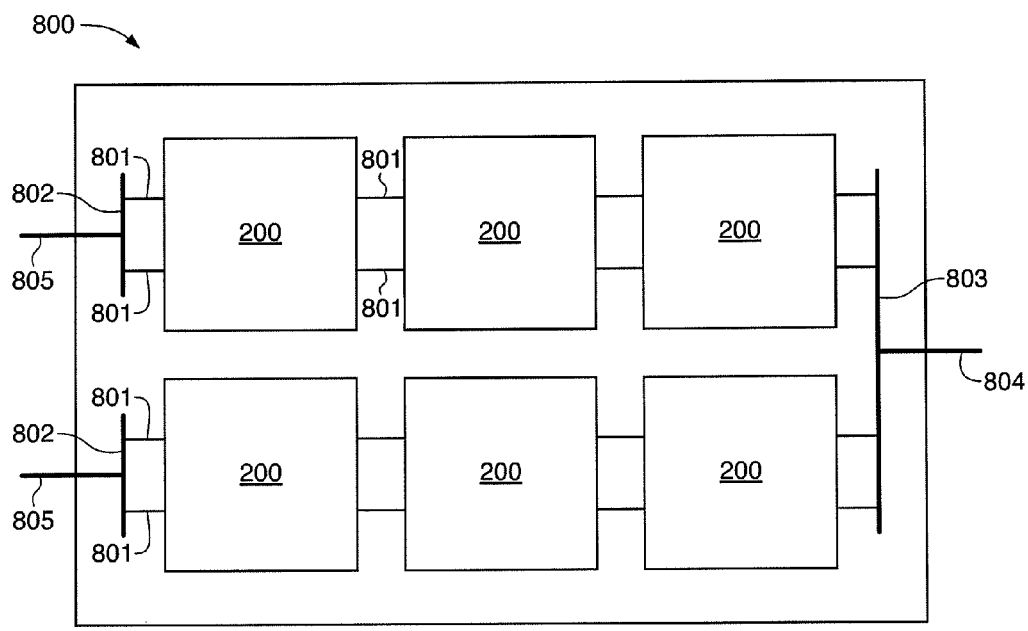
FIG. 8A illustrates a photovoltaic module including a plurality of photovoltaic devices in accordance with a disclosed embodiment.
FIG. 8B illustrates a photovoltaic structure in accordance with a disclosed embodiment.

FIG. 8A illustrates a photovoltaic module 800 including a plurality of photovoltaic devices 200, which can be solar cells. Each of the solar cells 200 is electrically connected via leads 801 to buses 802, 803. The buses 802, 803 can be electrically connected to leads 804, 805, which can be used to electrically connect a plurality of modules 800 in an array to form a photovoltaic structure 900, as shown in FIG. 8B.

While disclosed embodiments have been described in detail, it should be readily understood that the invention is not limited to the disclosed embodiments. Rather the disclosed embodiments can be modified to incorporate any number of variations, alterations, substitutions or equivalent arrangements not heretofore described.

What is claimed as new and desired to be protected by Letters Patent of the United States is:

1. A photovoltaic device comprising:
   a light-penetrable support layer;
   a first buffer layer containing a n-type dopant, wherein the first buffer layer comprises at least one of tin oxide, zinc tin oxide, or cadmium zinc oxide;
   a second buffer layer containing the n-type dopant over the first buffer layer;
   a third buffer layer containing the n-type dopant over the second buffer layer;
   at least one transparent conductive oxide layer between the support layer and the first buffer layer;
   a continuous semiconductor window layer containing the n-type dopant over the third buffer layer, wherein the dopant concentration in the semiconductor window layer is higher than the dopant concentration in the first buffer layer; and
   a semiconductor absorber layer over the semiconductor window layer.

2. The device of claim 1, wherein the first buffer layer has a thickness from about 100 Å to about 1000 Å.

3. The device of claim 2, wherein the concentration of the dopant in the first buffer layer is less than about $1\times10^{18}$ atoms/cm$^3$.

4. The device of claim 1, wherein the dopant is selected from a group III element of the periodic table.

5. The device of claim 1, wherein the n-type dopant in the first buffer layer diffuses into the semiconductor window layer during at least one of semiconductor processing and subsequent thermal processing.

6. A photovoltaic device comprising:
   a light-penetrable support layer;
   a first buffer layer containing a n-type dopant;
   a second buffer layer over the first buffer layer;
   a third buffer layer over the second buffer layer;
   at least one transparent conductive oxide layer between the support layer and the first buffer layer;
   a semiconductor window layer over the second buffer layer;
   wherein the semiconductor window layer contains a portion of the dopant that diffused from the first buffer layer through the second buffer layer and third buffer layer,
   wherein the second buffer layer and the third buffer layer contain a portion of the dopant that diffused from the first buffer layer; and
   wherein the dopant concentration in the semiconductor window layer is higher than the dopant concentration in the first buffer layer; and
   a semiconductor absorber layer over the semiconductor window layer.

7. The device of claim 6, wherein each of the first and second buffer layers have a thickness from about 100 Å to about 1000 Å.

8. The device of claim 7, wherein the concentration of the dopant in the first buffer layer is less than about $1\times10^{18}$ atoms/cm$^3$.

9. The device of claim 6, wherein the second buffer layer contains a different amount of the n-type dopant than the first buffer layer.

10. The device of claim 6, wherein the dopant is selected from a group III element of the periodic table.

11. The device of claim 6, wherein each of the first and second buffer layers comprise at least one of tin oxide, zinc tin oxide or cadmium zinc oxide.

12. The device of claim 6, wherein the n-type dopant in the first buffer layer diffuses through the second buffer layer into the semiconductor window layer during at least one of semiconductor processing and subsequent thermal processing.

* * * * *